United States Patent
Lee et al.

(10) Patent No.: US 10,055,168 B2
(45) Date of Patent: Aug. 21, 2018

(54) DELAYING HOT BLOCK GARBAGE COLLECTION WITH ADAPTATION

(71) Applicant: SK hynix Inc., Gyeonggi-do OT (KR)

(72) Inventors: Frederick K. H. Lee, Mountain View, CA (US); Xiangyu Tang, San Jose, CA (US); Lingqi Zeng, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 121 days.

(21) Appl. No.: 15/253,123

(22) Filed: Aug. 31, 2016

(65) Prior Publication Data
US 2017/0060428 A1 Mar. 2, 2017

Related U.S. Application Data

(60) Provisional application No. 62/212,371, filed on Aug. 31, 2015.

(51) Int. Cl.
*G06F 12/00* (2006.01)
*G06F 3/06* (2006.01)
*G06F 13/16* (2006.01)
*G11C 16/10* (2006.01)

(52) U.S. Cl.
CPC ............ *G06F 3/0652* (2013.01); *G06F 3/061* (2013.01); *G06F 3/0616* (2013.01); *G06F 3/0688* (2013.01); *G06F 13/16* (2013.01); *G11C 16/10* (2013.01)

(58) Field of Classification Search
None
See application file for complete search history.

(56) References Cited

U.S. PATENT DOCUMENTS

| | | | |
|---|---|---|---|
| 8,799,561 B2 | 8/2014 | Bux et al. | |
| 9,645,924 B2 * | 5/2017 | Fisher | G06F 12/0253 |
| 2013/0124945 A1 * | 5/2013 | Hu | H03M 13/13 714/773 |
| 2015/0268861 A1 * | 9/2015 | Bux | G06F 12/0646 711/103 |
| 2017/0192716 A1 * | 7/2017 | Ko | G06F 3/0608 |
| 2017/0242592 A1 * | 8/2017 | Camp | G06F 3/0605 |

* cited by examiner

*Primary Examiner* — John A Lane
(74) *Attorney, Agent, or Firm* — IP & T Group LLP (57) ABSTRACT

Memory systems may include a memory storage, and a controller suitable for measuring a write amplification (WA) value of a first, current window, comparing the WA value for the first window with a previous WA value for a previous window, and calculating and setting a value of a ratio threshold based on the comparison of the WA value for the current window threshold to the WA value of the previous window threshold.

18 Claims, 8 Drawing Sheets

DELAYING HOT BLOCK GARBAGE COLLECTION WITH ADAPTATION

CROSS-REFERENCE TO RELATED APPLICATIONS

This application claims the benefit of U.S. Provisional Application No. 62/212,371 filed Aug. 31, 2015, the entire contents of which are incorporated herein by reference.

BACKGROUND

1. Field

Exemplary embodiments of the present disclosure relate to a memory system and an operating method thereof.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

Separating hot and cold data via garbage collection processes is desired for the improved effectiveness and lifespan of flash memory products, and thus improved methods of doing so are needed.

SUMMARY

Aspects of the invention include memory systems. The memory systems may include a memory storage, and a controller suitable for measuring a write amplification (WA) value of a first, current window, comparing the WA value for the first window with a previous WA value for a previous window, and calculating and setting a value of a ratio threshold based on the comparison of the WA value for the current window threshold to the WA value of the previous window threshold.

Further aspects of the invention include methods. The methods may include measuring, with a controller, a write amplification (WA) value of a first, current window, comparing, with the controller, the WA value for the first window with a previous WA value for a previous window, and calculating and setting, with the controller, a value of a ratio threshold based on the comparison of the WA value for the current window threshold to the WA value of the previous window threshold.

Additional aspects of the invention include memory devices. The memory devices may include a memory storage, and a controller configured to measure a write amplification (WA) value of a first, current window, compare the WA value for the first window with a previous WA value for a previous window, and calculate and set a value of a ratio threshold based on the comparison of the WA value for the current window threshold to the WA value of the previous window threshold.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
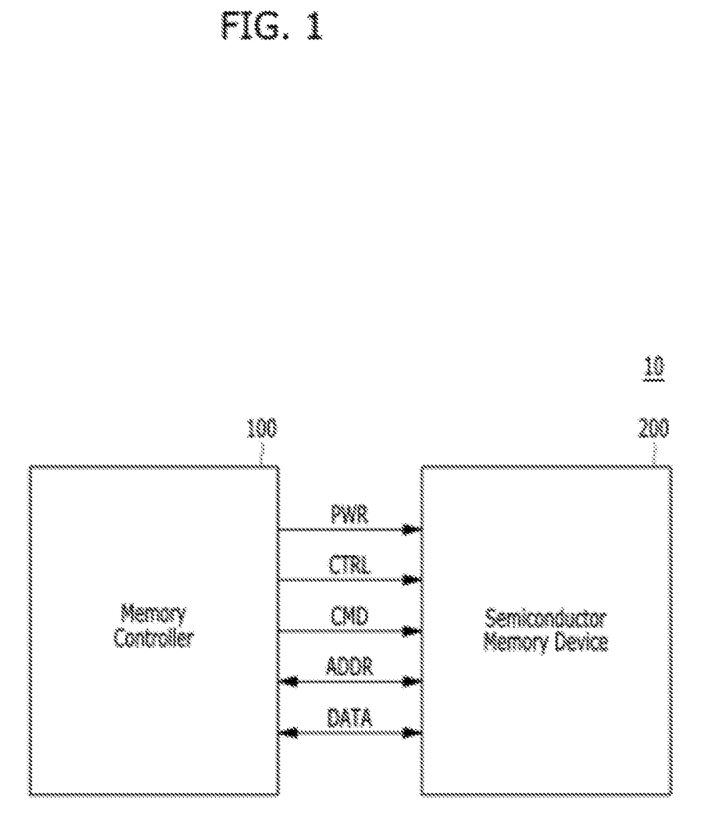
FIG. 1 is a block diagram schematically illustrating a memory system in accordance with an embodiment of the present invention.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
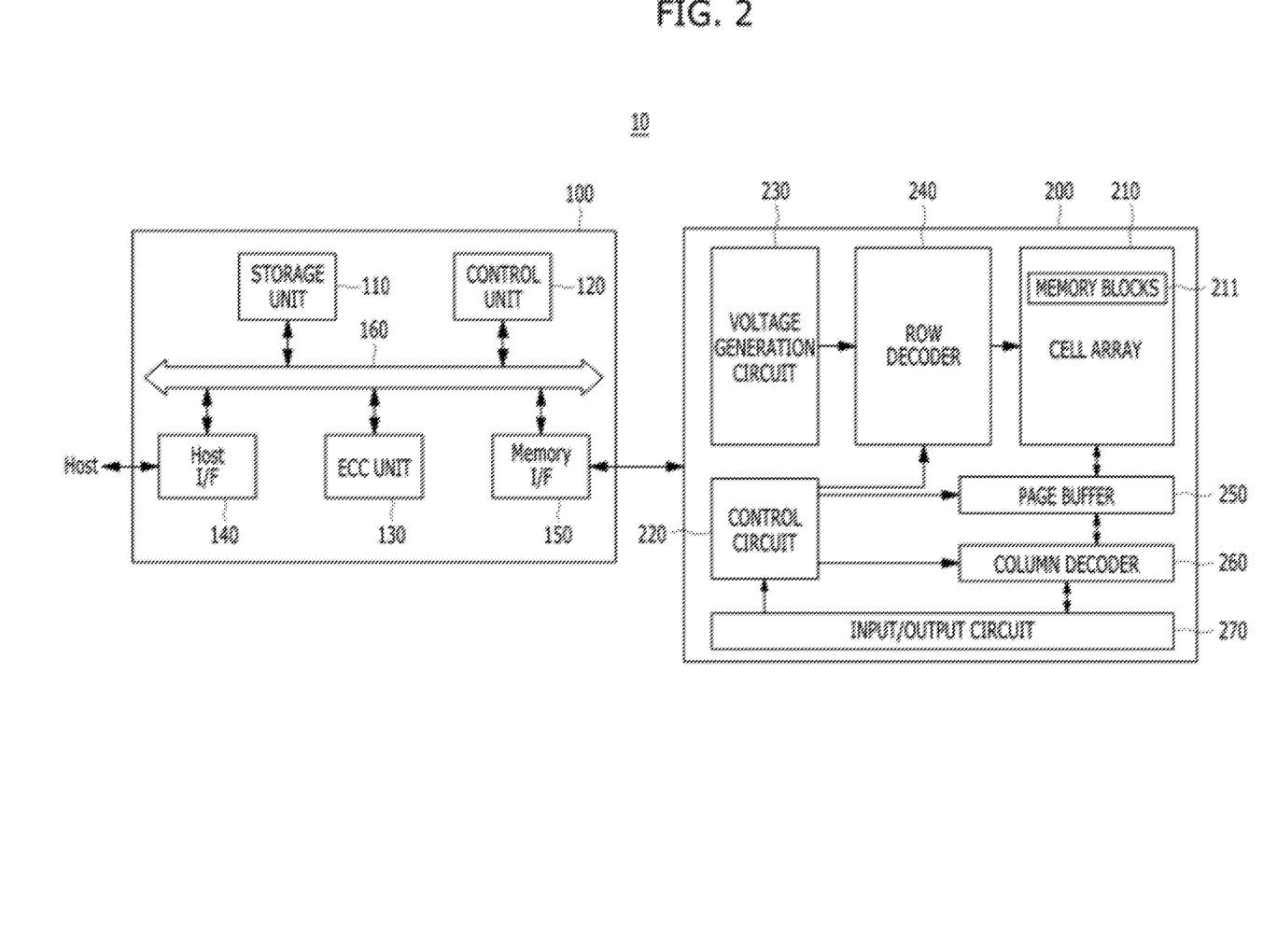
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
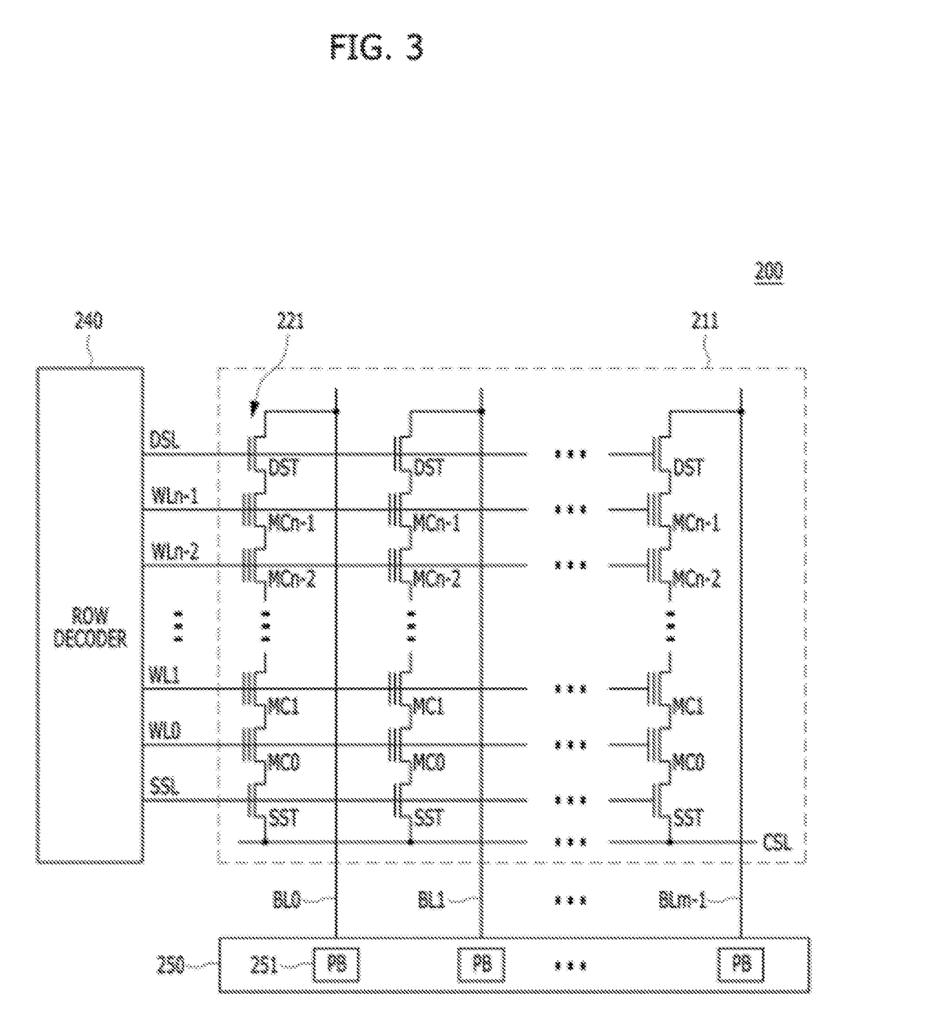
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
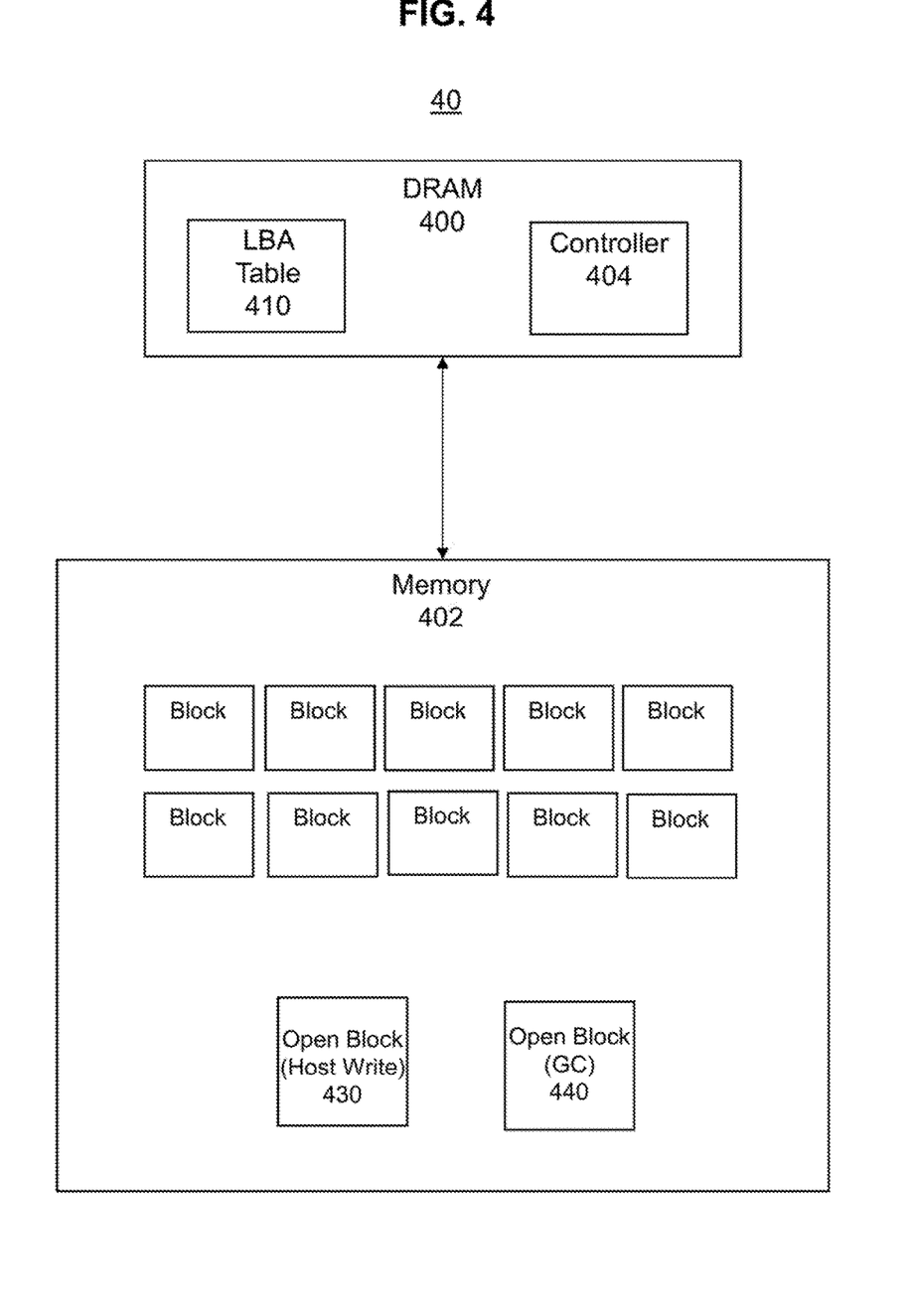
FIG. 4 is a diagram of an example system according to aspects of the invention.

FIG. 4 is a diagram of an example system 40 according to aspects of the invention. The system 40 includes a DRAM 400 portion and a memory 402 portion. The DRAM portion 400 may include an LBA table 410 for mapping LBA addresses and a controller 404, such as the controllers described above. The DRAM 400 portion may be a volatile memory and may be in communication with the memory portion 402. The memory portion 402 may be a non-volatile memory portion. The memory portion 402 may include a plurality of memory blocks (e.g., or memory super blocks), as well as an open block for host writes 430 and an open block for garbage collection (GC) 440.

A simple method for choosing garbage collection (GC) victim blocks that achieves the effect of hot and cold data separation has been disclosed in U.S. application Ser. No. 15/152,352 entitled "DATA SEPARATION BY DELAYING HOT BLOCK GARBAGE COLLECTION", the contents of which are disclosed by reference herein. In the method, two candidate victim blocks are identified for each instance of GC. The first candidate is the block with the minimum number of valid pages among all the closed blocks in a drive, while the second candidate is the block with the minimum number of valid pages among only the M oldest closed blocks in the drive, where M denotes the size of the pool of oldest closed blocks. The method then computes the valid page ratio of the number of valid pages of the second candidate to that of the first candidate and compares it against a ratio threshold k. If the valid page ratio is larger than k, the first candidate is selected as the final victim block. Otherwise, the second candidate is selected.

The parameters M and k may be jointly optimized for a given over-provisioning (OP) value and traffic pattern. Although the amount of OP is fixed ahead of time when a drive is first designed, the traffic pattern, unfortunately, may not be known in advance, and the traffic pattern may also be time-varying. Thus, pre-determined values for M and k are often suboptimal for the actual traffic pattern seen by a drive, which inevitably results in a higher write amplification (WA) value.

To mitigate the aforementioned problem, an adaptive algorithm that periodically adjusts the value of k to lower WA is disclosed herein. Instead of trying to adjust both the values of k and M together, the invention adapts the value of k while M remains fixed at a pre-determined value. This is because formulating an algorithm to adapt both parameters together is very difficult. In addition, WA is more sensitive to changes in k than M, which means changing the value of k is more effective in lowering WA than changing the value of M. Note that the proposed algorithm does not assume any a priori knowledge of the traffic pattern, which may be time-varying.

Figure 5:
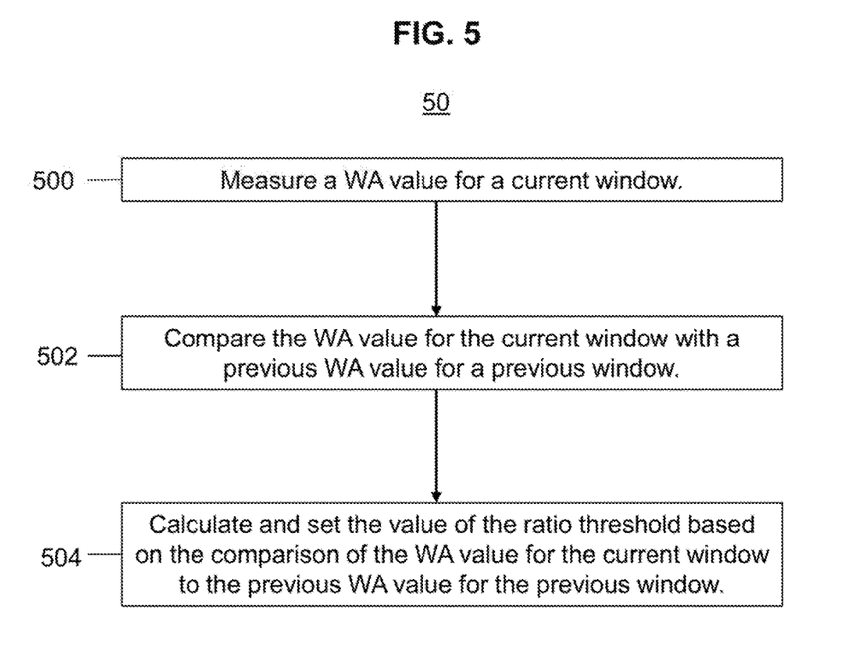
FIG. 5 is a flowchart of steps in a method for adapting delay of GC according to aspects of the invention.

Referring to FIG. 5, a flowchart 50 of steps for adjusting a ratio threshold K are shown. At step 500, a WA value is measured for a current window. At step 502, a WA value for the current window is compared with a WA value of a previous window. At step 504, the value of the ratio threshold K is calculated and set based on the comparison of the WA value of the current window to the WA value of the previous window.

An adaptive algorithm without the aid of a priori or side information adjusts the value of a parameter by periodically increasing or decreasing its value by a small amount according to some feedback metric. The proposed algorithm described in this disclosure follows the same approach. The feedback metric used in the proposed algorithm is the difference between two WA values measured in two consecutive time windows. Based on the difference, the algorithm determines the direction of the adjustment, i.e., whether to increase or decrease the value of k, as well as the magnitude of the adjustment.

In one embodiment, a WA value is recorded for every window of N drive writes. $WA_{curr}$ and $WA_{prev}$ denote the WA value measured over the most recent time window and the second most recent time window, respectively. If $WA_{curr}$ is less than $WA_{prev}$, whatever the direction of adjustment chosen last is deemed correct as a lower WA is obtained after the last adjustment. Therefore, the direction will remain unchanged for the next adjustment. Otherwise, the opposite direction is chosen. For the magnitude of the adjustment, it is set proportional to the magnitude of the difference in the WA values, i.e., $|WA_{prev} - WA_{curr}|$. This procedure is then repeated at the end of each new time window.

An example algorithm is shown schematically below.
Initialization:
Set $k=k_{initial}$.
Set $WA_{prev}=WA_{curr}=0$.
Set dir=1.
Repeat at the end of every N drive writes:
Set $WA_{prev}=WA_{curr}$.
Compute $WA_{curr}$ for the most recent window of N drive writes.
If $WA_{prev}!=0$
If $(WA_{prev}-WA_{curr})<0$, set dir=-dir.
Compute: $k=k+dir \times \mu \times |WA_{prev}-WA_{curr}|$.
If $k<k_{lower\_limit}$, set $k=k_{lower\_limit}$.
In the algorithm, $k_{initial}$ and $k_{lower\_limit}$ denote the initial value and the lower limit of k, respectively; dir is a binary variable that denotes the direction of adjustment, where 1 and −1 represents increasing and decreasing the value of k, respectively; and μ denotes the proportionality constant for the magnitude of the adjustment. Note that the purpose of having $k_{lower\_limit}$ is to prevent k from becoming too small, which may lead to higher WA values for some traffic patterns.

Implementation of the algorithm is relatively straightforward as the computations involved in the algorithm are quite simple. Moreover, since the algorithm is only run at the end of every N drive writes, where N can be any real number, the overhead in using the algorithm is low.

Figure 6:
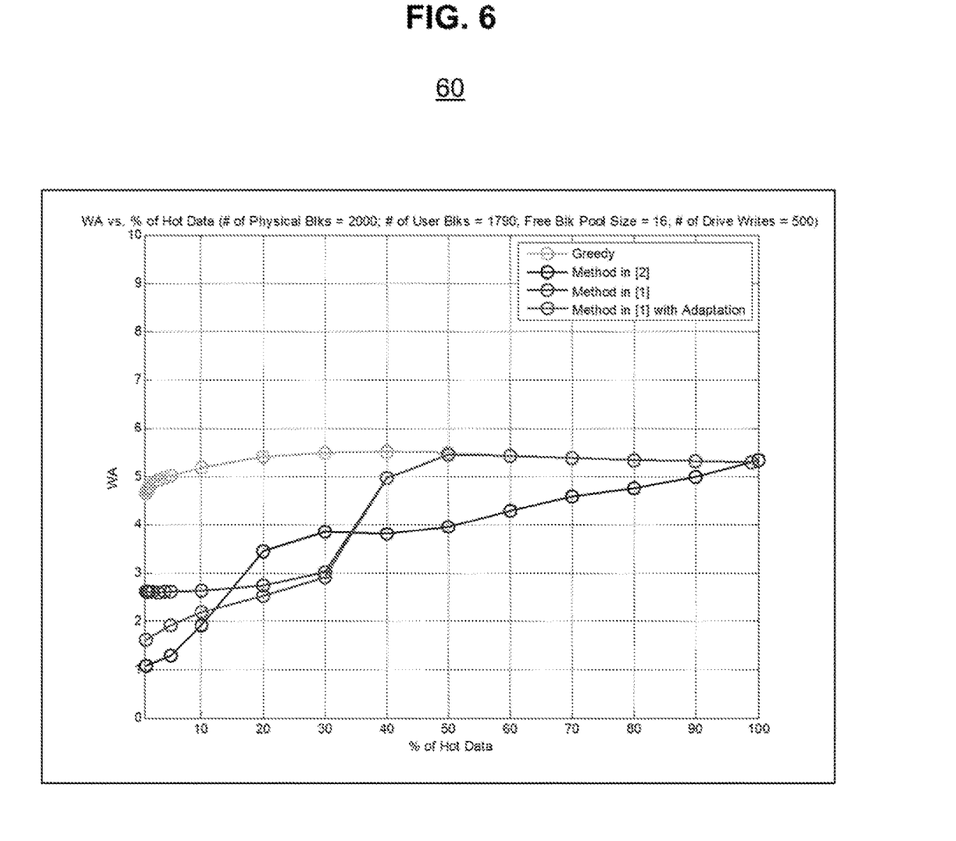
FIGS. 6, 7, and 8 are graphs showing performance results in accordance with aspects of the invention.

An example simulation is described below. The values of the drive parameters used in the simulations are:
Number of user blocks=1790;
Number of blocks in free block pool=16;
Also, M is fixed at 1000. The values of the parameters are set as:
$k_{initial}=k_{lower\_limit}=1.4$;
μ=0.35;
N=0.25;

FIG. 6 is a graph 600 showing the relationship between cumulative WA after 500 drive writes and the percentage of hot data in a traffic pattern for a fixed OP value of 11.73%. Lower WA values are obtained by using the proposed adaptive algorithm for traffic patterns with hot data ranging from 1% to 30%, with the largest improvements seen between 1% and 10%. These results show that the proposed adaptive algorithm is most effective for traffic patterns with a small percentage of hot data.

Figure 7:
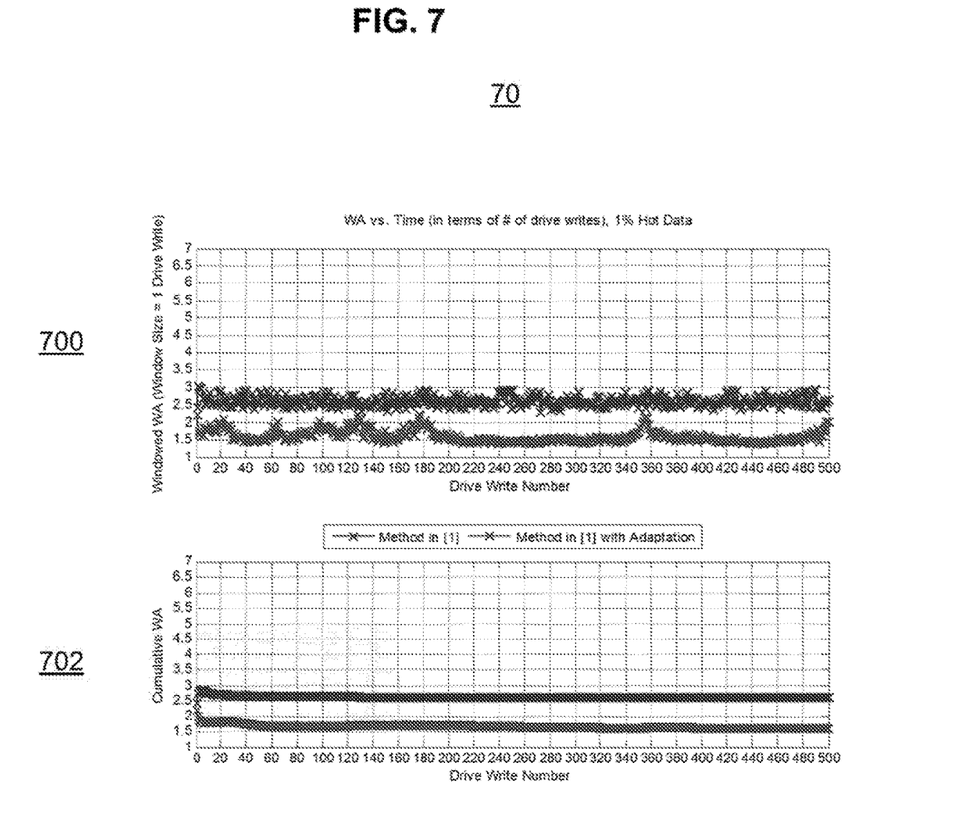
Figure 8:
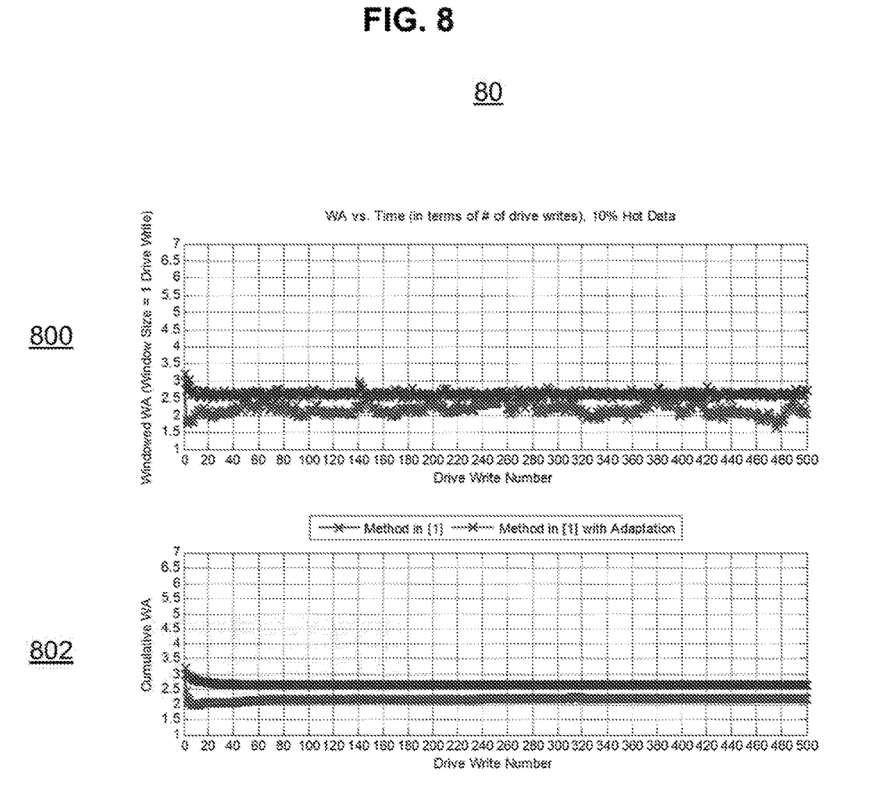

FIG. 7 and FIG. 8 are graphs 70 and 80 illustrating the variations of WA values as a function of time for the traffic patterns with 1% and 10% of hot data, respectively. In the figures, time is measured in terms of the number of drive writes. The top graph 700, 800 in each figure shows the variations of windowed WA values, where the window size is 1 drive write, while the bottom graphs 702, 802 shows the variations of cumulative WA values. The figures show that the WA values with adaptation are consistently lower than the WA values without adaptation.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A memory system, comprising:
a memory storage including a plurality of memory blocks, and
a controller suitable for selecting a victim memory block, among the plurality of memory blocks, for garbage collection (GC) by:
measuring a write amplification (WA) value of a first, current window;
comparing the WA value for the first window with a previous WA value for a previous window;
calculating and setting a value of a ratio threshold based on the comparison of the WA value for the current window to the WA value of the previous window; and
using the ratio threshold to determine which of a first candidate memory block and a second candidate memory block, from among the plurality of memory blocks, to select as the victim memory block.

2. The memory system of claim 1, wherein the calculating includes selecting a direction of an adjustment to the value of the ratio threshold.

3. The memory system of claim 1, wherein the ratio threshold comprises a threshold against which a ratio of a number of valid pages in the second candidate memory block to a number of valid pages in the first candidate memory block is compared to select the first or second candidate memory block as the victim memory block for GC.

4. The memory system of claim 1, wherein the calculating includes adjusting the value of the ratio threshold based on a predetermined proportionality constant.

5. The memory system of claim 1, wherein the first current window and the previous window are the most current windows.

6. The memory system of claim 1, wherein the controller is suitable for setting the value of the ratio threshold to be above a ratio threshold lower limit value to prevent the ratio threshold value from becoming too small.

7. A method, comprising:
    measuring, with a controller, a write amplification (WA) value of a first, current window;
    comparing, with the controller, the WA value for the first window with a previous WA value for a previous window;
    calculating and setting, with the controller, a value of a ratio threshold based on the comparison of the WA value for the current window to the WA value of the previous window; and
    using the ratio threshold to determine which of a first candidate memory block and a second candidate memory block, from among a plurality of memory blocks in a memory storage, to select as a victim memory block for garbage collection (GC).

8. The method of claim 7, wherein the calculating includes selecting a direction of an adjustment to the value of the ratio threshold.

9. The method of claim 7, wherein the ratio threshold comprises a threshold against which a ratio of a number of valid pages in the second candidate memory block to a number of valid pages in the first candidate memory block is compared to select the first or second candidate memory block as the victim memory block for GC.

10. The method of claim 7, wherein the calculating includes adjusting the value of the ratio threshold based on a predetermined proportionality constant.

11. The method of claim 7, wherein the first current window and the previous window are the most current windows.

12. The method of claim 7, further comprising setting the value of the ratio threshold to be above a ratio threshold lower limit value to prevent the ratio threshold value from becoming too small.

13. A memory device, comprising:
    a memory storage including a plurality of memory blocks, and
    a controller configured to select a victim memory block, among the plurality of memory blocks, for garbage collection (GC) by performing operations to:
        measure a write amplification (WA) value of a first, current window;
        compare the WA value for the first window with a previous WA value for a previous window;
        calculate and set a value of a ratio threshold based on the comparison of the WA value for the current window to the WA value of the previous window; and
        use the ratio threshold to determine which of a first candidate memory block and a second candidate memory block, from among the plurality of memory blocks, to select as the victim memory block.

14. The memory device of claim 13, wherein the calculating includes selecting a direction of an adjustment to the value of the ratio threshold.

15. The memory device of claim 13, wherein the ratio threshold comprises a threshold against which a ratio of a number of valid pages in the second candidate memory block to a number of valid pages in the first candidate memory block is compared.

16. The memory device of claim 13, wherein the calculating includes adjusting the value of the ratio threshold based on a predetermined proportionality constant.

17. The memory device of claim 13, wherein the first current window and the previous window are the most current windows.

18. The memory device of claim 13, wherein the controller is configured to set the value of the ratio threshold to be above a ratio threshold lower limit value to prevent the ratio threshold value from becoming too small.

* * * * *